United States Patent
Miyasaka (10) Patent No.: US 9,821,787 B2
(45) Date of Patent: Nov. 21, 2017

(54) CIRCUIT BOARD AND VEHICLE BRAKE HYDRAULIC PRESSURE CONTROL UNIT

(71) Applicant: NISSIN KOGYO CO., LTD., Ueda, Nagano (JP)

(72) Inventor: Sakae Miyasaka, Nagano (JP)

(73) Assignee: AUTOLIV NISSIN BRAKE SYSTEMS JAPAN CO., LTD., Nagano (JP)

( * ) Notice: Subject to any disclaimer, the term of this patent is extended or adjusted under 35 U.S.C. 154(b) by 27 days.

(21) Appl. No.: 14/632,574

(22) Filed: Feb. 26, 2015

(65) Prior Publication Data

US 2015/0245483 A1    Aug. 27, 2015

(30) Foreign Application Priority Data

Feb. 27, 2014  (JP) ................. 2014-036346

(51) Int. Cl.
*H05K 7/10*      (2006.01)
*B60T 15/02*     (2006.01)
(Continued)

(52) U.S. Cl.
CPC .......... *B60T 15/028* (2013.01); *H05K 3/4015* (2013.01); *H05K 3/325* (2013.01);
(Continued)

(58) Field of Classification Search
CPC ............... H05K 3/341; H05K 3/3452; H05K 2201/09181; H05K 2201/09154;
(Continued)

(56) References Cited

U.S. PATENT DOCUMENTS 6,175,086 B1 *  1/2001  Nakamura .......... H05K 3/3405
                                                           174/261
7,098,408 B1 *  8/2006  Camerlo ............ H05K 1/111
                                                           174/260
(Continued)

FOREIGN PATENT DOCUMENTS

EP    0131492 A1    1/1985
EP    2290676 A1    3/2011
(Continued)

OTHER PUBLICATIONS

Machine translation of JP 09107173 (no date).*
Extended European Search Report for Appl. 15156919 dated Jul. 24, 2015, 6 pages.

*Primary Examiner* — Nicholas J Lane
(74) *Attorney, Agent, or Firm* — Andrew M. Calderon; Roberts Mlotkowski Safran Cole & Calderon, P.C.

(57) ABSTRACT

One embodiment provides a circuit board having a substrate and an electrode portion which is provided on the substrate. The electrode portion includes: a quadrangular land which is provided on a front surface of the substrate; a solder layer which is laminated on the whole of a front surface of the land; and a pad which is joined to a front surface of the solder layer. When the electrode portion is seen from thereabove, an outer circumferential line of the pad touches each of four sides of the land. Exposed portions where the solder layer is exposed are formed individually at four corners of a front surface of the electrode portion. And, the exposed portions are formed to have the same shape.

12 Claims, 6 Drawing Sheets

(51) Int. Cl.
*H05K 3/40* (2006.01)
*H05K 3/32* (2006.01)

(52) U.S. Cl.
CPC .............. *H05K 2201/09154* (2013.01); *H05K 2201/09381* (2013.01); *H05K 2201/10151* (2013.01); *H05K 2203/048* (2013.01)

(58) Field of Classification Search
CPC ....... H05K 2201/09381; H05K 3/4015; H05K 2203/048; H05K 3/325; H05K 2201/1031
USPC ........ 174/260, 261, 262, 263, 264; 361/767, 361/772, 773, 774
See application file for complete search history.

(56) References Cited

U.S. PATENT DOCUMENTS

| | | | |
|---|---|---|---|
| 8,039,758 B2 | 10/2011 | Ogawa | |
| 8,112,196 B2* | 2/2012 | Takayanagi | B60T 8/368 361/752 |
| 2002/0038723 A1* | 4/2002 | Takeda | H05K 3/3405 174/260 |
| 2002/0124994 A1* | 9/2002 | Tanaka | B60R 16/0239 165/80.2 |
| 2002/0179327 A1* | 12/2002 | Araki | H01L 24/83 174/260 |
| 2006/0172566 A1* | 8/2006 | Nakajima | H05K 1/111 439/67 |
| 2008/0149382 A1* | 6/2008 | Karasawa | G01R 31/2805 174/262 |
| 2008/0266824 A1 | 10/2008 | Wang | |
| 2011/0067911 A1* | 3/2011 | Ishikawa | B23K 1/0008 174/261 |
| 2013/0329389 A1 | 12/2013 | Hattori et al. | |

FOREIGN PATENT DOCUMENTS

| | | | |
|---|---|---|---|
| JP | 09107173 A | * | 4/1997 |
| JP | 4618298 | | 1/2011 |

* cited by examiner

CIRCUIT BOARD AND VEHICLE BRAKE HYDRAULIC PRESSURE CONTROL UNIT

CROSS-REFERENCE TO RELATED APPLICATION(S)

This application claims priority from Japanese Patent Application No. 2014-036346 filed on Feb. 27, 2014, the entire contents of which are incorporated herein by reference.

FIELD

An embodiment described herein generally relates to a circuit board with an electronic circuit and a vehicle brake hydraulic pressure control unit.

BACKGROUND

Plate-shaped electrode portions to which terminals of electric components such as sensors and the like are connected are provided on a circuit board which is used in a control unit of a vehicle brake hydraulic pressure control unit. Then, the electric components can be electrically connected to the electronic circuit by the terminals of the electric components being pressed against the electrode portions.

The electrode portion of the circuit board may include a pad which is soldered to a land provided on a front surface of a substrate.

In soldering the pad to the land, a reflow system is used in which a paste solder is applied to the front surface of the land, and the pad is superposed on the solder layer, thereafter the substrate is heated.

JP-4618298-B describes a self-alignment effect working in the soldering step of soldering the pad to the land in which the surface tension of the molten solder in the solder layer acts on the pad to move the pad directly above the land.

In soldering the pad to the land, although the pad can be moved directly above the land by means of the self-alignment of the solder layer, when the pad is disposed directly above the land, the surface tension of the solder layer does not act on the pad. Consequently, in case an impact or vibration is applied to the substrate in such a state that the pad is disposed directly above the land and the solder is melted, a problem will be caused that the pad is easily moved from the aligned state with the land.

SUMMARY

One object of the invention is to provide a circuit board which enables a pad to be superposed accurately on a land to be joined together by solving the problem described above and a vehicle brake hydraulic pressure control unit which includes the circuit board.

An aspect of the invention provides
a circuit board (10) having a substrate (11) and an electrode portion (20) which is provided on the substrate (11), the electrode portion (20) including:
a quadrangular land (21) which is provided on a front surface (11a) of the substrate (11);
a solder layer (22) which is laminated on the whole of a front surface of the land (21); and
a pad (23, 25, 27) which is joined to a front surface of the solder layer (22), wherein, when the electrode portion (20) is seen from thereabove, an outer circumferential line of the pad (23, 25, 27) touches each of four sides of the land (21),
wherein exposed portions (24, 26, 28) where the solder layer (22) is exposed are formed individually at four corners or four sides of a front surface of the electrode portion (20), and
wherein the exposed portions (24, 26, 28) are formed to have the same shape.

Numerals etc. in the brackets indicate exemplary correspondence with the reference sings used in the embodiment.

Based on the above aspect, there may be provided the circuit board,
wherein, when the electrode portion (20) is seen from thereabove, four sides of the pad (23) are superposed on the four sides of the land (21), and
wherein the exposed portions (24) are formed individually at four corners of the front surface of the electrode portion (20).

According to the above configuration, in the fabrication step of the circuit board, when the substrate is heated in such a state that the land, the solder layer and the pad are superposed one on another, the pad is disposed directly above the land by the self-alignment effect of the solder layer which is melted, whereby the four sides of the pad are superposed on the four sides of the land. This forms the exposed portions of the same shape individually at the four corners of the front surface of the electrode portion. The solder layer which is melted flows outwards of the corner portions of the pad at the exposed portions.

When the solder layer is melted, equal pressing forces act on the pad from the exposed portions along diagonal lines of the pad by means of the surface tension of the solder layer. On the contrary, when the solder layer is solidified, pulling forces act on the pad from the exposed portions along the diagonal lines of the pad by means of the surface tension of the solder layer.

Since the pressing forces or the pulling forces act equally on the corner portions of the pad from the solder layer in such a state that the pad is disposed directly on the land and the solder layer is melted, even in the event that an impact or vibration is applied to the substrate, the pad can be prevented from being moved in relation to the land.

In the circuit board described above, in the event that the pad has the quadrangular shape, when the pad is superposed on the solder layer, the exposed portions of the same shape can be formed individually at the four corners of the electrode portion by chamfering equally the four corner portions. Then, the corner portions of the pad can be chambered in a straight line or C chamfered or chamfered round or R chamfered, thereby to enhancing the degree of freedom in designing the electrode portion.

Based on the above aspect, there may be provided the circuit board,
wherein the pad (25) has a circular or ellipsoidal shape,
wherein, when the electrode portion (20) is seen from thereabove, the outer circumferential line of the pad (25) is inscribed in the four sides of the land (21), and
wherein the exposed portions (26) are formed individually at four corners of the front surface of the electrode portion (20).

According to the above configuration, in the fabrication step of the circuit board, when the outer circumferential line of the pad is inscribed in the four sides of the land, the exposed portions of the same shape are formed individually at the four corners of the front surface of the electrode portions, and the solder layer which is melted flows outwards of the pad at the exposed portions.

This causes equal pressing forces to act on the pad from the exposed portions when the solder layer is melted. On the other hand, equal pulling forces act on the pad from the exposed portions when the solder layer is solidified.

Thus, according to the above configuration, the pressing forces or pulling forces act equally on the pad in the four directions from the solder layer in such a state that the pad is disposed directly above the land and the solder layer is melted. Because of this, even in the event that an impact or vibration is applied to the substrate, the pad can be prevented from being moved in relation to the land.

Based on the above aspect, there may be provided the circuit board, wherein, when the electrode portion (20) is seen from thereabove, four sides of the pad (27) are superposed on the four sides of the land (21), and wherein the exposed portions (28) are formed individually on the four sides of the front surface of the electrode portion (20), the exposed portions (28) being formed at middle portions of the four sides.

According to the above configuration, in the fabrication step of the circuit board, when the four sides of the pad are superposed on the four sides of the land, the exposed portions of the same shape are formed individually on the four sides of the front surface of the electrode portion, and the solder layer which is melted flows outwards of the pad at the exposed portions.

This causes equal pressing forces to act on the middle portions of the four sides from the exposed portions when the solder layer is melted. On the contrary, when the solder layer is solidified, equal pulling forces act on the middle portions of the four sides of the pad from the exposed portions.

Consequently, according to the above configuration, the Pressing forces or pulling forces act equally on the middle portions of the four sides of the pad from the solder layer in such a state that the pad is disposed directly above the land and the solder layer is melted. Because of this, even in the event that an impact or vibration is applied to the substrate, the pad can be prevented from being moved in relation to the land.

The circuit board may be applied to the vehicle brake hydraulic pressure control unit.

In the circuit board and the vehicle brake hydraulic pressure control unit, since the pressing force or pulling force act equally on the pad from the four directions when the pad is disposed directly above the land and the solder layer is melted, even in the event that an impact or vibration is applied to the substrate, the pad can be prevented from being moved in relation to the land. Thus, the pad can be joined to the land accurately.

BRIEF DESCRIPTION OF DRAWINGS

FIGS. 3A to 3C show the electrode portion of the first embodiment, in which

FIGS. 6A and 6B show an electrode portion of a third embodiment, of which

DETAILED DESCRIPTION

Embodiments will be described with reference to the drawings.

In the embodiments, like reference numerals will be given to like constituent elements, so that the repetition of similar descriptions is omitted.

First Embodiment

In a first embodiment, a circuit board is included in an electronic control unit of a vehicle brake hydraulic pressure control unit.

In the following description, firstly, an overall configuration of the vehicle brake hydraulic pressure control unit will be described, and thereafter a circuit board will be described in detail.

Figure 1:
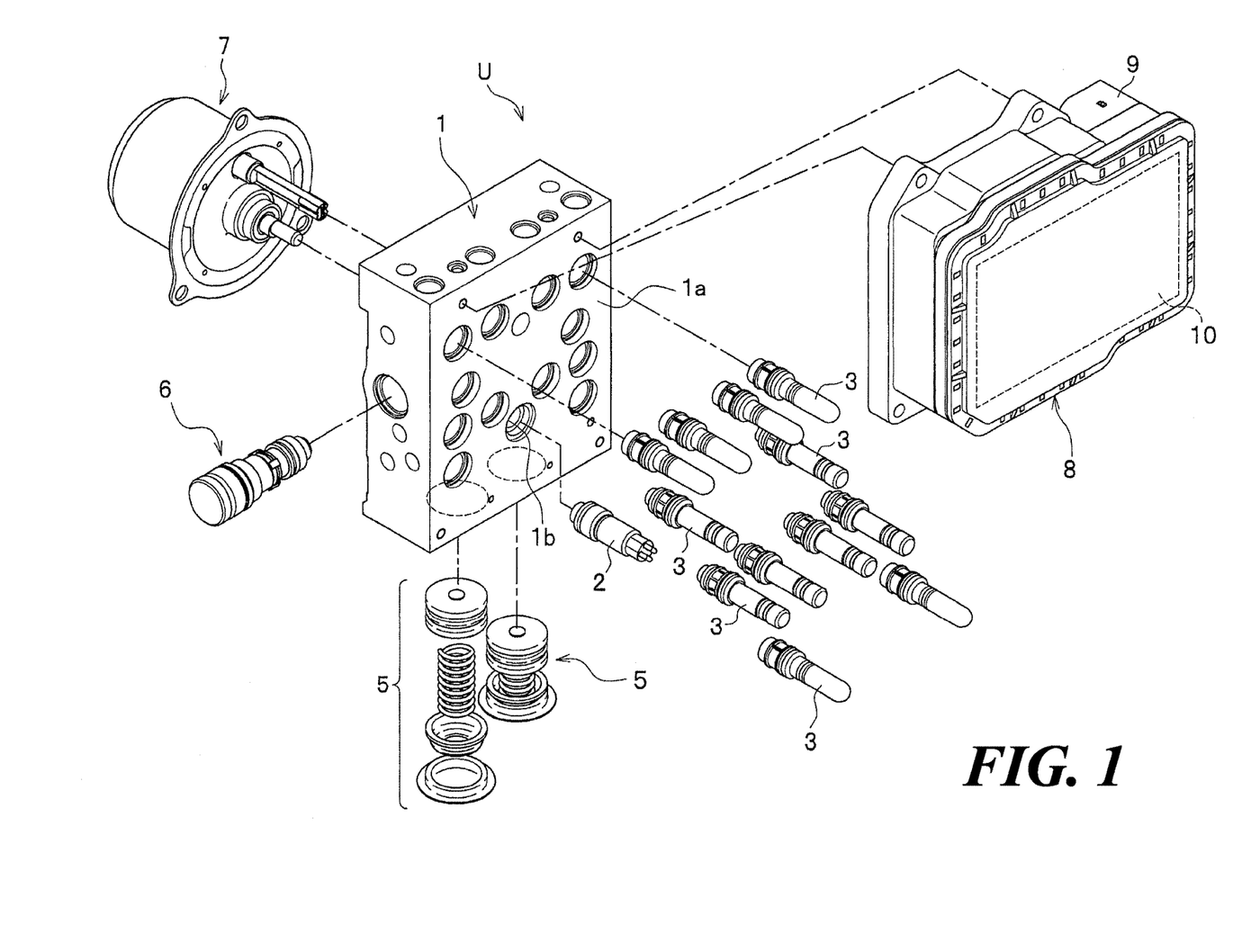
FIG. 1 is an exploded perspective view showing a vehicle brake hydraulic pressure control unit of a first embodiment.

A vehicle brake hydraulic control unit U shown in FIG. 1 is preferably used in such vehicles as a motorcycle, a motor tricycle, an all-terrain vehicle (ATV), a motor four-wheeled vehicle and the like.

The vehicle brake hydraulic pressure control unit U can execute an anti-lock braking control, a skid control which stabilizes the behaviors of the vehicle, a traction control and the like by controlling the brake hydraulic pressure as required which is given to respective wheels cylinders of wheels of the vehicle.

This vehicle brake hydraulic pressure control unit U can be mounted not only on a hybrid vehicle which uses an electric motor as well as an engine (an internal combustion engine) as its drive source but also on an electric vehicle and a fuel cell vehicle which use only an electric motor as its drive source, in addition to a motor vehicle which uses only the engine as its drive source.

The vehicle brake hydraulic pressure control unit U has a metallic, substantially rectangular parallelepiped base body 1. Various components such as a pressure sensor 2, solenoid valves 3, reservoirs 5, a pump 6, a motor 7, and the like are assembled to the base body 1. Additionally, an electronic control unit 8 is attached to one surface 1a of the base body 1.

Brake fluid hydraulic lines are formed in an interior of the base body 1. Additionally, holes are formed in the base body 1, and the pressure sensor 2, the solenoid valves 3, the reservoirs 5, the pump 6, the motor 7 and the like are installed in those holes. Further, inlet ports and outlet ports are formed in the base body 1, and pipings communicating with a master cylinder are connected to the inlet ports, while pipings reaching the wheel cylinders are connected to the outlet ports. The holes in the base body 1 communicate with each other directly or by way of the hydraulic pressure lines formed in the interior of the base body 1.

Figure 2A:
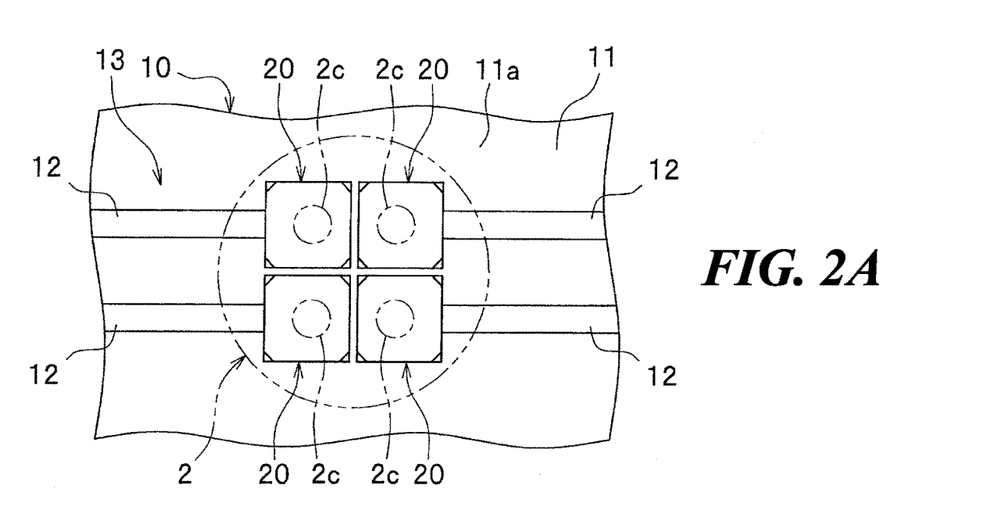
FIG. 2A is a plan view showing electrode portions of the first embodiment.
Figure 2B:
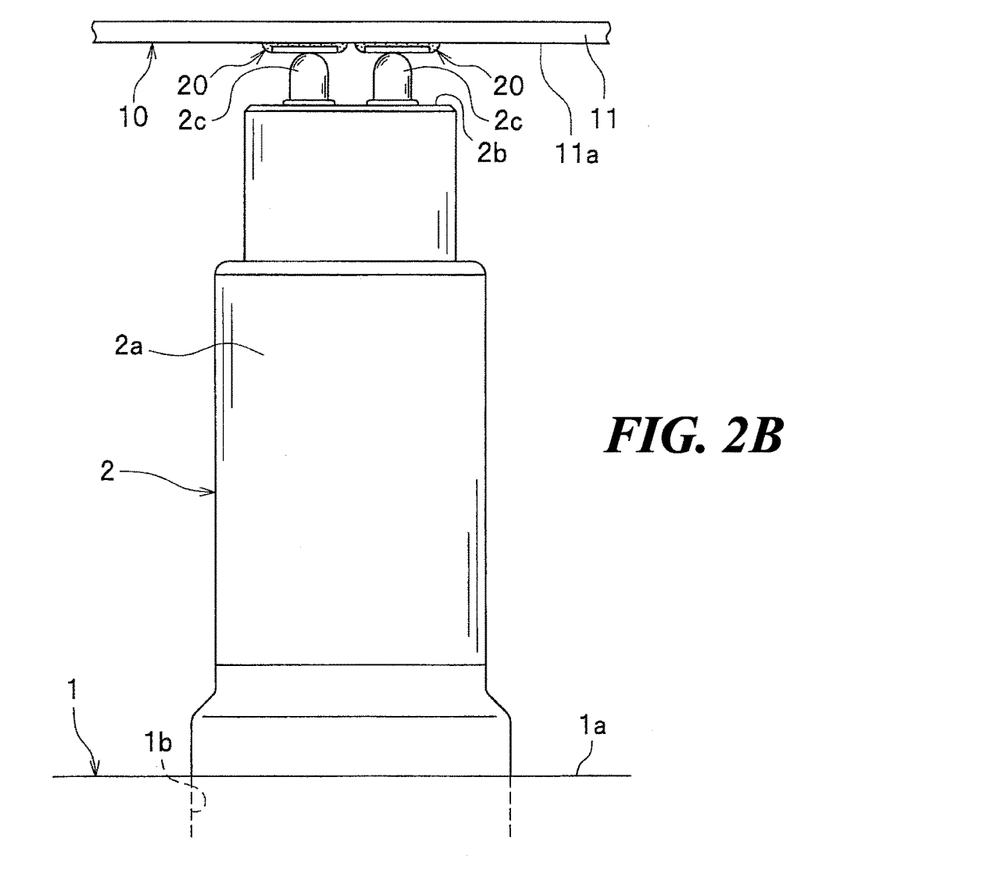
FIG. 2B is a side view showing a circuit board and a pressure sensor of the first embodiment.

The pressure sensor 2 is an electric component which measures a brake hydraulic pressure in the hydraulic pressure lines in the base body 1. As shown in FIG. 2B, the pressure sensor 2 has a cylindrical sensor housing 2a. A base portion of the sensor housing 2a is inserted in a mounting hole 1b which is formed in the one surface 1a of the base body 1. On the other hand, a distal end portion of the sensor housing 2a projects from the mounting hole 1b.

Four terminals 2c are provided at a distal end face 2b of the pressure sensor 2 so as to project therefrom. The terminals 2c are metallic cylindrical members, and distal end portions are closed into a semi-spherical shape. The four terminals 2c are disposed into a square matrix configuration (refer to FIG. 2A).

A coil spring is accommodated in an interior of the terminal 2c in a compressed state. The distal end portion of the terminal 2c is biased in a direction in which the terminal 2c projects from the distal end face 2b of the sensor housing 2a by means of a pressing force of the coil spring.

A detecting portion (not shown) is accommodated in the sensor housing 2a, and this detecting portion measures a brake hydraulic pressure in the hydraulic pressure lines. The detecting portion converts a value of the brake hydraulic pressure so measured into an electric signal and outputs the electric signal to the terminals 2c.

As shown in FIG. 1, the electronic control unit 8 includes a circuit board 10 and a housing 9 which accommodates the circuit board 10.

The housing 9 is a synthetic resin box member which is secured to the one surface 1a of the base body 1 in such a state that the housing 9 covers the electric components such as the solenoid valves 3 and the pressure sensor 2 which project from the one surface 1a of the base body 1.

The solenoid valves 3, the pressure sensor 2 and the like are accommodated in a rear side (a base body 1 side) area in an interior space of the housing 9. Additionally, the circuit board 10 is accommodated in a front side area of the interior space of the housing 9.

The circuit board 10 controls the operations of the electric components such as the solenoid valves 3, the motor 7 and the like based on pieces of information which are obtained from the pressure sensor 2 and various sensors, as well as programs which are stored in advance therein.

The circuit board 10 has a synthetic resin, rectangular substrate 11. As shown in FIG. 2A, electronic components (not shown) such as semiconductor chips are mounted on a surface of the substrate 11, and wirings 12 which connect electrically the electronic components together are printed on the substrate 11, whereby an electronic circuit 13 is provided.

As shown in FIG. 2B, electrode portions 20 are provided on the electronic circuit 13, and the terminals 2c of the pressure sensor 2 are connected to these electrode portions 20. The electrode portions 20 are provided on one surface 11a (a base body 1 side surface) of the substrate 11.

As shown in FIG. 2A, the terminals 2c of the pressure sensor 2 are connected individually to the set of four electrode portions 20. The four electrode portions 20 are disposed into a square matrix configuration. Then, the distal end portions of the terminals 2c are pressed individually against surfaces of the electrode portions 20, whereby the pressure sensor 2 is electrically connected to the electronic circuit 13 (refer to FIG. 2B).

Figure 3A:
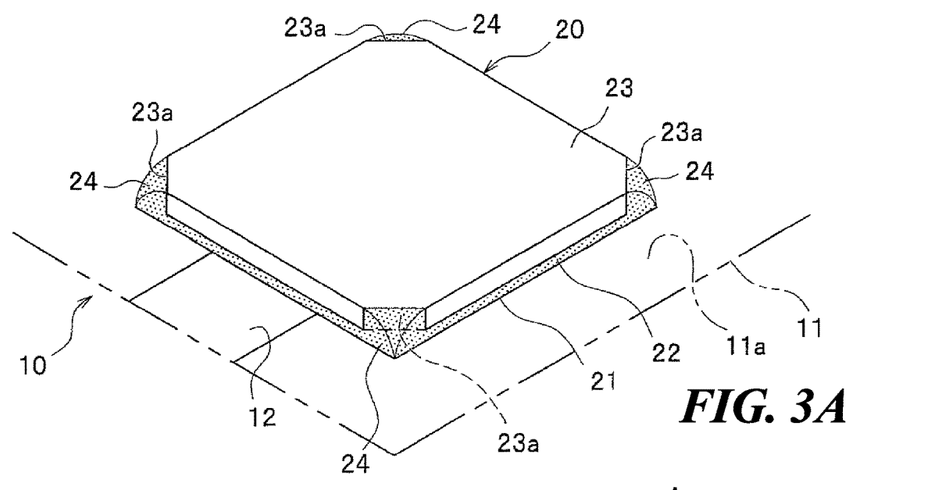
FIG. 3A is a perspective view.

As shown in FIG. 3A, the electrode portion 20 includes a land 21 (refer to FIG. 4) which is provided on the one surface 11a of the substrate 11, a solder layer 22 which is superposed on the land 21, and a pad 23 which is superposed on the solder layer 22. The electrode portion 20 is formed by soldering the pad 23 on to the land 21.

Figure 3B:
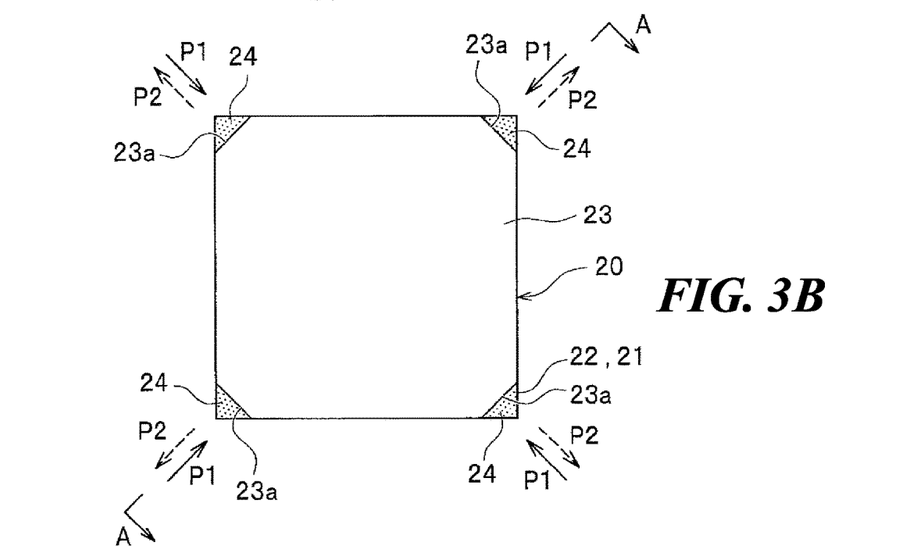
FIG. 3B is a plan view.

As shown in FIG. 3B, in this embodiment, the electrode portion 20 is formed into a square shape when seen from thereabove. Additionally, exposed portions 24 are formed at four corners of a front surface of the electrode portion 20. The solder layer 22 is exposed to the front surface side at the exposed portions 24.

Although the electrode portion 20 according to this embodiment has a square shape when seen from thereabove, the electrode portion 20 may have a rectangular shape.

Figure 4:
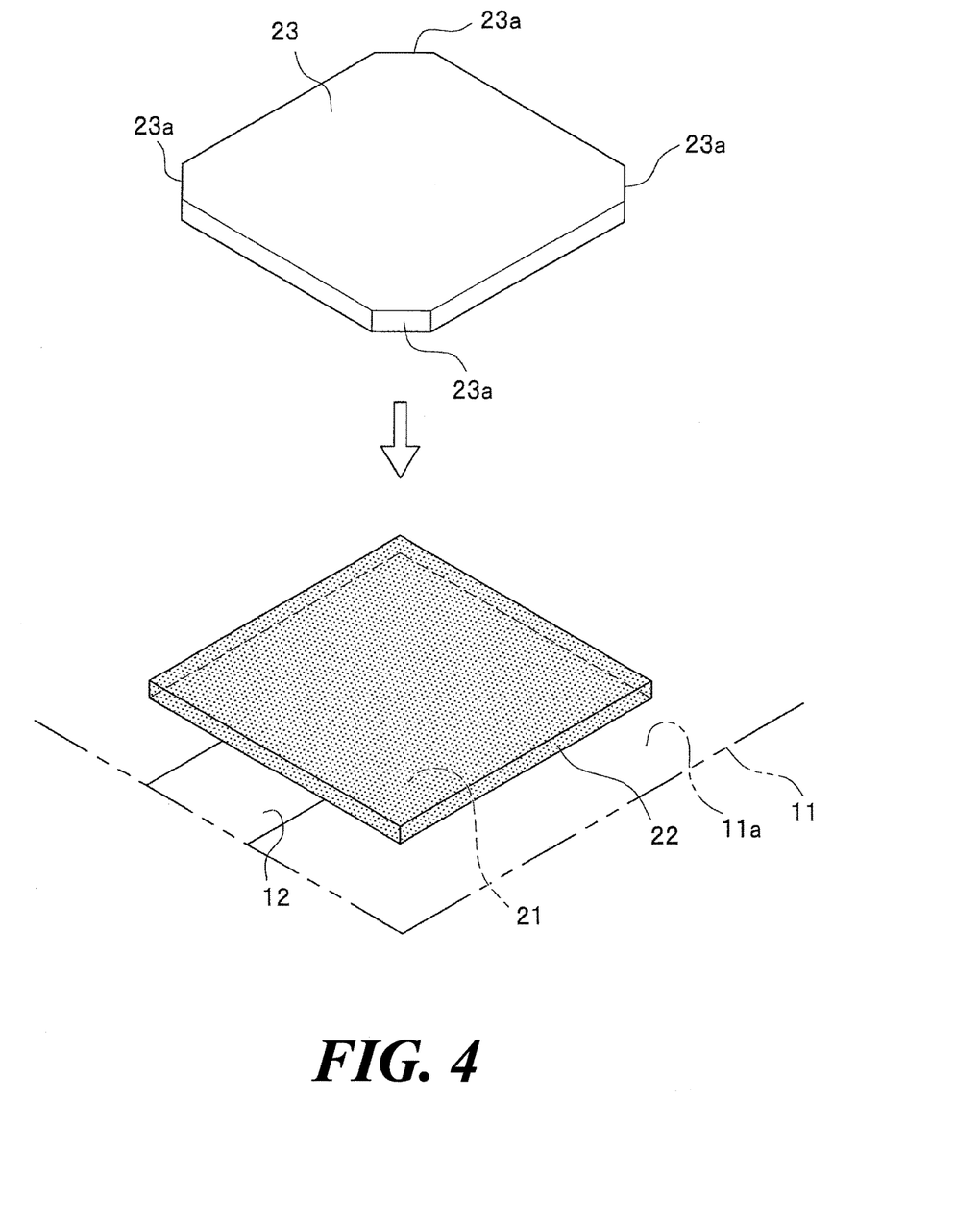
FIG. 4 is a perspective view of the electrode portion of the first embodiment showing a state resulting before a pad is joined to a solder layer.

As shown in FIG. 4, the land 21 is a square metallic foil which is printed on the one surface 11a of the substrate 11. The wiring 12 which is printed on the one surface 11a of the substrate 11 is connected to the land 21.

A whole surface of the land 21 is covered by the solder layer 22. Namely, the square solder layer 22 is superposed on the front surface of the land 21. When the solder layer 22 is seen from thereabove, four sides of the solder layer 22 are superposed on four sides of the land 21.

As shown in FIG. 3B, the pad 23 is a quadrangular metallic plate. When referred to in the first embodiment, the quadrangular shape also includes a shape which is chamfered at four corners thereof.

The pad 23 is superposed on the front surface of the solder layer 22. When the pad 23 is seen from thereabove, four sides of the pad 23 are superposed on the four sides of the solder layer 22 and the four sides of the land 21. Side surfaces of the pad 23 which extend along the four sides thereof are exposed to front sides of side surfaces of the solder layer 22.

In the pad 23, four corner portions of the square metallic plate are chamfered equally. In a state resulting before the corner portions of the metallic plate are chambered, a length of each side of the metallic plate is the same as a length of each side of the land 21. The corner portions 23a of the pad 23 of the first embodiment are cut into a straight line relative to one side of the pad 23. In this way, the corner portions 23a of the pad 23 are C chamfered.

With the pad 23 superposed on the solder layer 22, since the corner portions 23a of the pad 23 are smaller than the corner portions of the solder layer 22, the exposed portions 24 are formed in which the solder layer 22 is exposed at the four corners of the front surface of the electrode portion 20.

Since the individual corner portions 23a of the pad 23 are equally chamfered, the exposed portions 24 have the same rectangular equilateral triangular shapes when viewed from thereabove.

When the pad 23 is affixed to the land 21, part of the solder layer 22 flows into the individual exposed portions 24, and part of the solder layer 22 is disposed outside the corner portions 23a of the pad 23 (refer to FIG. 3A).

Next, in a fabrication step of the circuit board 10 shown in FIG. 3A, a procedure of forming the electrode portion 20 by using a reflow-type soldering approach will be described.

Firstly, as shown in FIG. 4, a paste solder is applied to the whole of the front surface of the land 21 which is provided on the one surface 11a of the substrate 11, and the solder layer 22 is laminated on the whole of the front surface of the land 21. Further, the pad 23 is superposed on the front surface of the solder layer 22. The pad 23 is disposed on the front surface of the solder layer 22 so that the four sides of the pad 23 are disposed in the same direction as the four sides of the land 21.

Following this, the substrate 11 is heated in such a state that the land 21, the solder layer 22 and the pad 23 are superposed one on another. By doing so, the solder layer 22 is melted, creating a state in which the pad 23 is floating on the front surface of the solder layer 22.

Figure 3C:
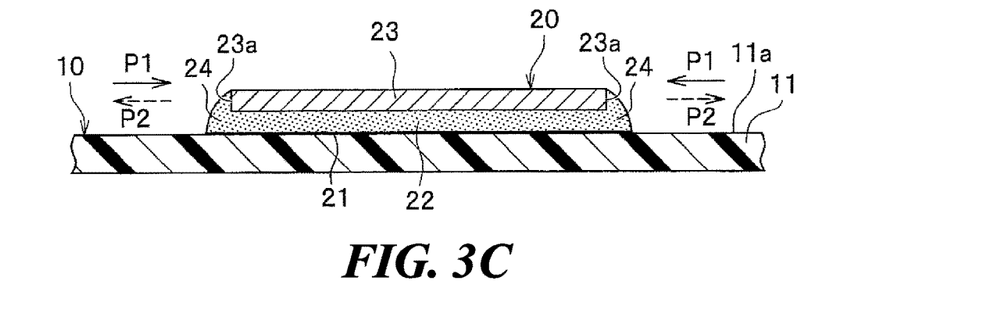
FIG. 3C is a sectional view of the electrode portion taken along a line A-A in FIG. 3B.

As this occurs, as shown in FIG. 3C, the surface tension of the solder layer 22 which is melted acts on the pad 23, whereby a self-alignment effect is produced in which the pad 23 moves directly above the land 21. As a result of this, as shown in FIG. 3B, an outer circumferential line of the pad 23 touches each of the four sides of the land 21 when seen from thereabove. More specifically, when the pad 23 is seen from thereabove, the four sides of the pad 23 are superposed on the four sides of the solder layer 22 and the four sides of the land 21. Additionally, the exposed portions 24 having the same shape when seen from thereabove are formed at the four locations outside the corner portions of the pad 23.

At the exposed portions 24, the solder layer 22 flows upwards along the side surfaces of the corner portions 23a of the pad 23 by means of the surface tension of the solder layer 22 which is melted. This causes part of the solder layer 22 to flow on to upper portions of the exposed portions 24 as shown in FIG. 3A, whereby part of the solder layer 22 is disposed to sides of the corner portions 23a of the pad 23.

The solder layer 22 visible at the exposed portions 24 has the same shape when viewed from thereabove, and the volume of the solder which flows to the exposed portions 24 to stay thereat is equal at the individual exposed portions 24.

When the solder layer 22 is melted, equal pressing forces act on the pad 23 from the exposed portions 24 along diagonal lines of the pad 23 by means of the surface tension of the solder layer 22 (refer to FIG. 3C). Namely, the pressing force acts equally in a direction indicated by an arrow P1 towards a central portion of the pad 23 from the four corner portions 23a of the pad 23.

When the substrate 11 is cooled and the solder layer 22 is solidified, equal pulling forces act on the pad 23 from the exposed portions 24 along the diagonal lines of the pad 23 by means of the surface tension of the solder layer 22 (refer to FIG. 3C). Namely, the pulling force acts equally in a direction indicated by an arrow P2 towards the central portion of the pad 23 from the four corner portions 23a of the pad 23.

As a result of the solder layer 22 being solidified, the solder layer 22 is joined to the front surface of the land 21, and the pad 23 is joined to the front surface of the solder layer 22. This causes the pad 23 to be joined to the land 21 by the solder layer 22.

In the circuit board 10 described above, as shown in FIG. 3B, the pad 23 is disposed directly above the land 21, and in such a state that the solder layer 22 is melted, the pressing force or the pulling force acts equally on the corner portions 23a of the pad 23 from the solder layer 22 at the exposed portions 24. Because of this, when the pad 23 is soldered to the land 21, even in the event that an impact or vibration is applied to the substrate 11, the pad 23 can be prevented from being moved relative to the land 21.

Thus, while the first embodiment has been described heretofore, the invention is not limited thereto and hence can be altered or modified as required without departing from the spirit and scope of the invention.

Figure 5A:
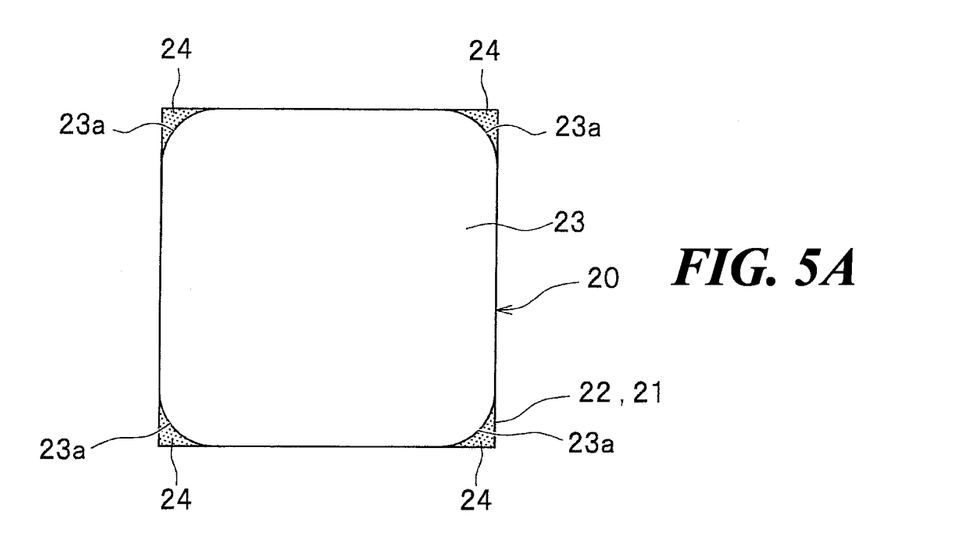
FIG. 5A is a plan view showing another configuration of the electrode portion of the first embodiment.

In the circuit board 10 of the first embodiment, while the four corner portions 23a of the pad 23 are chamfered into a straight line (C chamber) as shown in FIG. 3B, the exposed portions 24 may be formed by chamfering round the corner portions 23a of the pad 23 (R chamfer) as shown in FIG. 5A. No limitation is imposed on the shape of the corner portions 23a of the pad 23, thereby enhancing the degree of freedom in designing the electrode portion 20.

In the first embodiment, while the four corner portions of the quadrangular pad 23 are chamfered, the pad should have a shape which allows the four sides of the pad are superposed on the four sides of the land 21, and hence, for example, an octagonal pad can also be used.

In addition, a shape of the electrode portion 20 when seen from thereabove is not limited to a square shape, but can be a rectangular shape, as long as the pressing force or the pulling force acts equally on the corner portions 23a of the pad 23 when the solder layer 22 is melted.

Second Embodiment

Figure 5B:
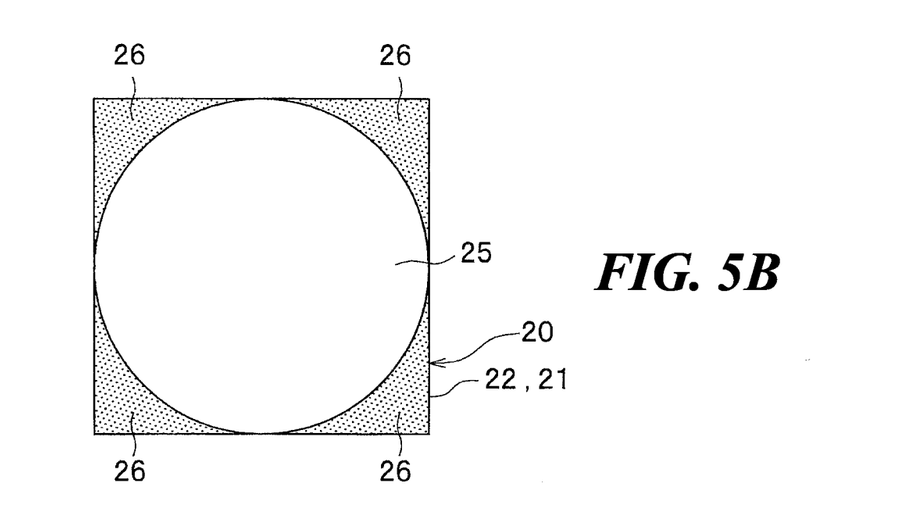
FIG. 5B is a plan view showing an electrode portion of a second embodiment.

Next, a second embodiment will be described. A circuit board of the second embodiment has substantially the same configuration as that of the circuit board 10 of the first embodiment, and as shown in FIG. 5B, the circuit board of the second embodiment differs from the circuit board 10 of the first embodiment in that a pad 25 has a different shape.

The pad 25 of the second embodiment is a circular metallic plate. The pad 25 is disposed in relation to a land 21 so that when an electrode portion 20 is seen from thereabove, an outer circumferential line of the pad 25 is inscribed in four sides of the land 21. Then, exposed portions 26 having the same shape are formed at four corners of a front surface of the electrode portion 20.

In the electrode portion 20 of the second embodiment, when a solder layer 22 is melted, equal pressing forces act on the pad 25 from the exposed portions 26. When the solder layer 22 is solidified, equal pulling forces act on the pad 25 from the exposed portions 26.

The pressing forces and the pulling forces act equally on the pad 25 from the exposed portions 26 along diagonal lines of the land 21.

Consequently, in the electrode portion 20 of the second embodiment, the pad 25 is disposed directly above the land 21, and in such a state that the solder layer 22 is melted, the pressing forces or pulling forces act equally on the pad 25 from the solder layer 22 within the exposed portions 26. Because of this, even in the event that an impact or vibration is applied to a substrate 11, the pad 25 can be prevented from being moved in relation to the land 21.

Also in the second embodiment, the electrode portion 20 may have a rectangular shape when seen from thereabove, and the pad 25 may have an ellipsoidal shape when seen from thereabove, as long as the pressing force or the pulling force acts equally on the pad 25 from the exposed portions 26 when the solder layer 22 is melted.

Third Embodiment

Figure 6A:
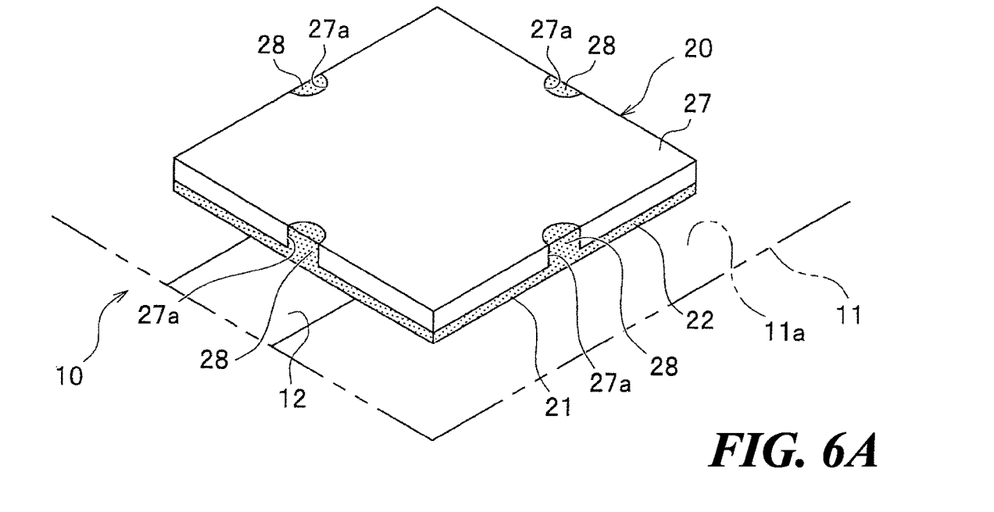
FIG. 6A is a perspective view and FIG. 6B is a plan view of the electrode portion.

Next, a third embodiment will be described. A circuit board of the third embodiment has substantially the same configuration as that of the circuit board 10 of the first embodiment, and as shown in FIG. 6A, the circuit board of the second embodiment differs from the circuit board 10 of the first embodiment in that the shape and position of exposed portions 28 are different.

Figure 6B:
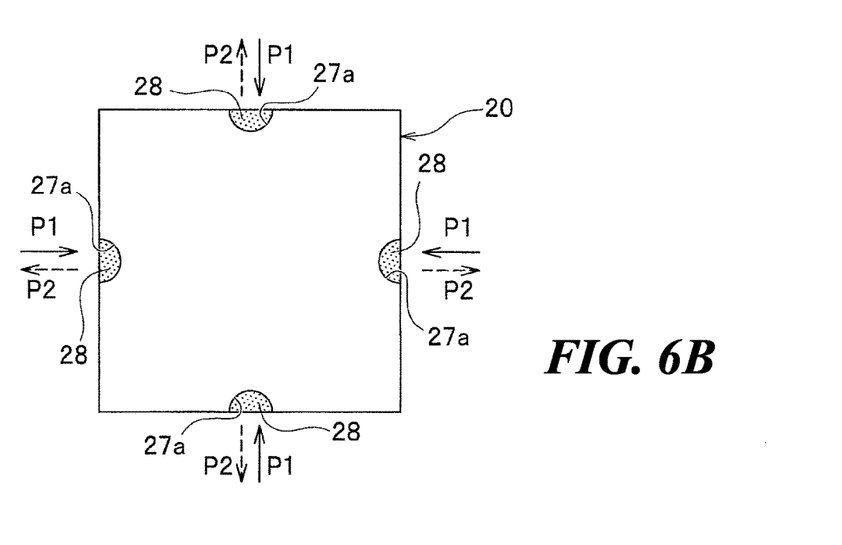

In an electrode portion 20 of the third embodiment, as shown in FIG. 6B, semicircular recess portions 27a are formed individually in four sides of a pad 27. The recess portions 27a are formed to have the same shape when seen from thereabove.

An outer circumferential line of the pad 27 touches each of the four sides of the land 21 when seem from thereabove. More specifically, the four sides of the pad 27 are superposed on four sides of a land 21, such that exposed portions 28 are formed in four sides of a front surface of the electrode portion 20. The exposed portions 28 are formed individually at middle portions of the four sides of the electrode portion 20. The exposed portions 28 are formed to have the same shape when seen from thereabove.

In the electrode portion 20 of the third embodiment, when a solder layer 22 is melted, equal pressing forces act on the middle portions of the four sides of the pad 27 from the corresponding exposed portions 28 in directions which are at right angles to the corresponding sides (arrows P1). On the contrary, when the solder layer 22 is solidified, equal pulling forces act on the middle portions of the four sides of the pad 27 from the corresponding exposed portions 28 in directions which are at right angles to the corresponding sides (arrows P2).

Consequently, in the electrode portion 20 of the third embodiment, the pressing forces or pulling forces act equally on the middle portions of the four sides of the pad 27 from the solder layer 22 in the exposed portions 28 in the directions which are at right angles to the corresponding sides of the pad 27 in such a state that the pad 27 is disposed directly above the land 21 and the solder layer 22 is melted. Because of this, even in the event that an impact or vibration is applied to a substrate 11, the pad 27 can be prevented from being moved in relation to the land 21.

In the electrode portion 20 of the third embodiment, a limitation is not imposed on the shape of the recess portions 27a of the pad 27, that is, the shape of the exposed portions 28, and hence, quadrangular or triangular recess portions (exposed portions) may be formed.

In the above-described first to third embodiments, although the circuit board is applied to the vehicle brake hydraulic pressure control unit, the circuit board may be applied to control units of various apparatuses.

Also in the third embodiment, the electrode portion 20 may have a rectangular shape when seen from thereabove, as long as the pressing force or the pulling force acts equally on the pad 27 from the exposed portions 28 when the solder layer 22 is melted.

In the first to third embodiments that have been described heretofore, no limitation is imposed on the shapes of the pad and the exposed portions, provided that equal pressing forces or pulling forces act on the pad from the four directions.

The invention claimed is:

1. A circuit board having a substrate and an electrode portion which is provided on the substrate, the electrode portion including:
   a quadrangular land which is provided on a front surface of the substrate;
   a solder layer which is laminated on the whole of a front surface of the land; and
   a pad which is joined to a front surface of the solder layer,
   wherein, when the electrode portion is seen from thereabove, an outer circumferential line of the pad touches each of four sides of the land,
   wherein exposed portions where the solder layer is exposed are formed individually at four corners of a front surface of the electrode portion,
   wherein the exposed portions are formed to have the same shape,
   wherein the electrode portion is a square shape or rectangular shape when seen from thereabove, and
   wherein the pad is a quadrangular metallic plate with chamfered corners that form the exposed portions.

2. The circuit board of claim 1,
   wherein, when the electrode portion is seen from thereabove, four sides of the pad are superposed on the four sides of the land, and
   wherein the exposed portions are formed individually at four corners of the front surface of the electrode portion.

3. The circuit board of claim 2,
   wherein the pad has four corner portions which are chamfered equally.

4. A vehicle brake hydraulic pressure control unit having:
   a base body in which a brake fluid line is formed; and
   an electronic control unit which is attached to the base body,
   wherein the electronic control unit includes the circuit board of claim 1.

5. The circuit board of claim 1, wherein the substrate is a synthetic resin, rectangular substrate.

6. The circuit board of claim 1, wherein terminals of a pressure sensor are connected to the electrode portion.

7. The circuit board of claim 1, wherein the quadrangular land is a square metallic foil which is printed on the front surface of the substrate.

8. The circuit board of claim 7, wherein wiring which is printed on the front surface of the substrate is connected to the quadrangular land.

9. The circuit board of claim 1, wherein
   the pad is superposed on a front surface of the solder layer,
   when the pad is seen from thereabove, four sides of the pad are superposed on the four sides of the solder layer and the four sides of the quadrangular land.

10. The circuit board of claim 1, wherein four corner portions of the pad are chamfered equally.

11. The circuit board of claim 10, wherein the exposed portions have a same rectangular equilateral triangular shapes when viewed from thereabove.

12. The circuit board of claim 1, wherein the chamfered corners are rounded corner portions.

* * * * *